(12) United States Patent
Mori et al.

(10) Patent No.: US 8,268,940 B2
(45) Date of Patent: Sep. 18, 2012

(54) FLAME-RETARDANT ADHESIVE RESIN COMPOSITION AND ADHESIVE FILM USING THE SAME

(75) Inventors: Akira Mori, Kisarazu (JP); Kiwamu Tokuhisa, Kisarazu (JP); Kazuhiko Nakahara, Kitakyushu (JP); Masashi Kaji, Kitakyushu (JP)

(73) Assignee: Nippon Steel Chemical Co., Ltd., Tokyo (JP)

( * ) Notice: Subject to any disclaimer, the term of this patent is extended or adjusted under 35 U.S.C. 154(b) by 468 days.

(21) Appl. No.: 12/530,152

(22) PCT Filed: Mar. 6, 2008

(86) PCT No.: PCT/JP2008/054061
§ 371 (c)(1),
(2), (4) Date: Sep. 4, 2009

(87) PCT Pub. No.: WO2008/111489
PCT Pub. Date: Sep. 18, 2008

(65) Prior Publication Data
US 2010/0063217 A1 Mar. 11, 2010

(30) Foreign Application Priority Data
Mar. 8, 2007 (JP) .................................. 2007-058199

(51) Int. Cl.
*C08L 63/00* (2006.01)
*C08L 79/08* (2006.01)
*C08L 83/10* (2006.01)
*B32B 27/28* (2006.01)
*B32B 27/38* (2006.01)

(52) U.S. Cl. ........ 525/533; 525/449; 525/476; 252/601; 252/609

(58) Field of Classification Search .......................... None
See application file for complete search history.

(56) References Cited

U.S. PATENT DOCUMENTS

| 4,543,295 A | 9/1985 | St. Clair et al. |
| 5,677,393 A * | 10/1997 | Ohmori et al. ................. 525/423 |
| 2003/0069357 A1 * | 4/2003 | Kaji et al. ..................... 525/107 |
| 2007/0254986 A1 * | 11/2007 | Tendou et al. ................. 523/440 |

FOREIGN PATENT DOCUMENTS

| JP | 52-91082 A | | 8/1977 |
| JP | 62246922 A | * | 10/1987 |
| JP | 4-23879 A | | 1/1992 |
| JP | 4-29393 A | | 1/1992 |
| JP | 4-36366 A | | 2/1992 |
| JP | 4-41581 A | | 2/1992 |
| JP | 2001-203467 A | | 7/2001 |
| JP | 2003-213241 A | | 7/2003 |
| JP | 2004-146286 A | | 5/2004 |
| JP | 2004-231792 A | | 8/2004 |
| JP | 2005-15761 A | | 1/2005 |
| JP | 2005-60489 A | | 3/2005 |
| JP | 2005-171044 A | | 6/2005 |
| WO | WO-03/104295 A1 | | 12/2003 |

OTHER PUBLICATIONS

Abstract of JP 62246922 A (no date).*
International Search Report for the Application No. PCT/JP2008/054061 mailed Jun. 10, 2008.
International Preliminary Report on Patentability for Application No. PCT/JP2008/054061 mailed Oct. 8, 2009.

* cited by examiner

*Primary Examiner* — Michael J Feely
(74) *Attorney, Agent, or Firm* — Cheng Law Group, PLLC

(57) ABSTRACT

Disclosed is a halogen- and phosphorus-free flame-retardant adhesive resin composition which can be used in heat contact bonding of adherends at or below 250° C. and is excellent in heat resistance, solder heat resistance after moisture absorption, and processability. Also disclosed is an adhesive film produced from said composition. The flame-retardant adhesive resin composition comprises 65-98% by weight of a silicone unit-containing polyimide resin and 2-35% by weight of an epoxy resin having an acenaphthylene-substituted naphthalene skeleton. The adhesive film produced from the flame-retardant adhesive resin composition is suitable as an adhesive for a laminate for a multiplayer printed circuit board substrate, an adhesive for a hybrid circuit board substrate, and an adhesive for a coverlay film.

12 Claims, No Drawings

FLAME-RETARDANT ADHESIVE RESIN COMPOSITION AND ADHESIVE FILM USING THE SAME

TECHNICAL FIELD

This invention relates to a heat-resistant adhesive resin composition and, more particularly, to an adhesive resin composition which is substantially free from halogens and phosphorus and highly heat-resistant and flame-retardant and to an adhesive film using the same.

BACKGROUND TECHNOLOGY

A laminate formed by attaching a metal foil to a base material such as phenolic resin-impregnated paper and epoxy resin-impregnated glass fibers to a base material such as a film of polyimide or polyethylene terephthalate has been used for a printed circuit board substrate.

In this specification, a laminate for a printed circuit board substrate refers to a laminate prior to formation of circuits, a laminate whose metal foil is processed to form circuits is referred to as a printed circuit board, and both are referred to as a printed circuit board substrate.

In recent years, the area for wiring in the printed circuit boards used in the fields of electric and electronic instruments and precision instruments is becoming increasingly smaller and this situation has created a growing demand for multi-layer printed circuit boards. A large variety of adhesives or adhesive films are used in fabrication of multiplayer printed circuit boards by lamination of printed circuit boards or in formation of composites from various kinds of circuit materials.

Adhesives in the form of prepregs prepared by impregnating fabrics such as glass fibers with epoxy resins or bismaleide-based resins are known for the aforementioned adhesives. However, the problem with them was their insufficient flexibility and inferior dimensional stability. Adhesives based on acrylonitrile butadiene rubber/phenolic resin, phenolic resin/butyral resin, and acrylonitrile butadiene rubber/epoxy resin have also been proposed (for example, in JPH4-29393 A, JPH4-36366 A, and JPH4-41581 A). However, these adhesives were not sufficient in chemical resistance, heat resistance, heat resistance after moisture absorption, and processability and they degrade markedly thermally and generate smears in drilling of through-holes.

Further, polyimide-based adhesives of excellent heat resistance have been proposed (for example, in U.S. Pat. No. 4,543,295). However, the polyimide used in such adhesives needs a temperature of 250° C. or above for heat contact bonding of copper to polyimide or polyimide to polyimide with a sufficient adhesive strength and this presents a difficulty in practical use.

The patent document 1 discloses an adhesive which is based on a polyimide resin prepared from a diaminopolysiloaxane and an aromatic tetracarboxylic acid as raw materials for heat contact bonding at low temperature. However, a polyimide resin of this kind alone has a defect of insufficient adhesive strength and poor reliability.

A polyimide-based adhesive of excellent adhesive strength is disclosed, for example, in the patent document 2; the adhesive film disclosed here is composed of a polyimideamide resin and an epoxy resin and intended for use as an adhesive in fabrication of flexible printed circuit boards (FPC). However, when this kind of film is used to bond printed circuit boards whose surface is made uneven as a result of formation of circuits in fabrication of multilayer printed circuit boards, the film is unable to fill the surface depressions of the circuit boards sufficiently and fails to provide sufficient solder heat resistance.

Under the circumstances, a demand has arisen for materials useful as adhesives for multilayer printed circuit board substrates and coverlay films with the emphasis laid on that the materials can be used in low temperature contact bonding of less than or equal to 250° C. and are excellent in adhesive strength, chemical resistance, solder heat resistance after moisture absorption, dimensional stability during wiring processing, and other properties. Furthermore, materials with an additional property of flame retardance are in demand from the viewpoint of securing safety from fire.

Resins or additives containing a halogen such as bromine have been used to provide conventional adhesive films with flame retardance. They have enjoyed universal use because of their ability to provide flame retardance, high cost performance, and the least tendency to degrade plastics. However, halogen-containing adhesives are feared to have a possibility of generating toxic substances such as dioxin when burned and removal of halogens is strongly demanded.

A variety of flame-retardant materials containing no halogen are being developed as substitutes for those containing halogens. The most general technique adopted in the developmental works is use of phosphorus-containing resins or addition of organic phosphorus compounds. Materials containing phosphorus compounds are disclosed, for example, in JP2004-231792 A, JP2005-15761 A, JP2005-171044 A, and JP2005-60489 A. However, phosphorus compounds are feared to have a possibility of contaminating soil and water and, in view of their present doubtful status regarding safety, it will become necessary to remove phosphorus compounds from flame-retardant materials in the future and adhesive films will be no exception.

In consideration of these matters, there is a demand for flame-retardant adhesive films which are free of halogens and phosphorus. Adhesive films of this type are described, for example, in the patent document 3. However, the adhesive films cited there had a problem in that their anti-migration properties deteriorate by the effect of components such as metal hydroxides.

The patent document 4 discloses a heat-resistant adhesive film which is composed of a silicone unit-containing polyimide resin and an epoxy resin and intended for printed circuit boards. However, the epoxy resin used here is an ordinary epoxy resin derived from bisphenol A or a phenolic resin and it appears that the kind of polyimide and a polyimide/epoxy resin combination are selected routinely without giving enough consideration to attain flame retardance. Further, the patent document 5 discloses an acenaphthylene-modified phenolic resin and an epoxy resin obtained by epoxidation of the naphthylene-modified phenolic resin. However, no disclosure is made on a possibility of combining the acenaphthylene-modified epoxy resin or any other epoxy resin with a polyimide resin to prepare an adhesive.

Patent document 1: JPH4-23879 A
Patent document 2: JPS52-91082 A
Patent document 3: JP2004-146286 A
Patent document 4: JP2001-203467 A
Patent document 5: WO2003/104295 pamphlet

DISCLOSURE OF THE INVENTION

Problems to be Solved by the Invention

An object of this invention is to provide a halogen- and phosphorus-free flame-retardant adhesive resin composition which can be used in low temperature contact bonding of less than or equal to 250° C., besides, and is excellent in properties such as heat resistance, solder heat resistance after moisture absorption, and property to being processed, and, even more particularly, to provide a flame-retardant adhesive film using said adhesive resin composition.

Means to Solve the Problems

The inventors of this invention have conducted intensive researches to attain the aforementioned objects and completed this invention by using a specified polyimide resin and a specified epoxy resin.

Accordingly, this invention relates to a flame-retardant adhesive resin composition comprising 65-98% by weight of a silicone unit-containing polyimide resin constituted of a repeating unit represented by the following general formula (1) and a repeating unit represented by the following general formula (2) at a molar ratio of the repeating unit represented by formula (1) to the repeating unit represented by general formula (2) in the range of 50/50 to 10/90 and 2-35% by weight of an acenaphthylene-modified epoxy resin obtained by epoxidizing a naphthol resin whose naphthalene rings are substituted with acenaphthenyl groups.

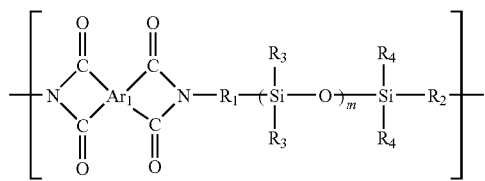

(1)

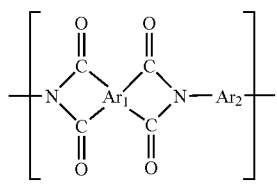

(2)

In general formula (1), $Ar_1$ is a tetravalent aromatic group, $R_1$ and $R_2$ each is a divalent hydrocarbon group, $R_3$ and $R_4$ each is a monovalent hydrocarbon group of 1-6 carbon atoms, and m is in the range of 1-20. In general formula (2), $Ar_1$ is a tetravalent organic group and $Ar_2$ is a divalent aromatic group.

The properties of a resin resulting from curing of the aforementioned flame-retardant adhesive resin composition can be improved by addition of 1-15 parts by weight of an epoxy resin curing agent to 100 parts by weight of the sum of the silicone unit-containing polyimide resin and the acenaphthylene-modified epoxy resin. Alternatively, the properties of the curing resin can be improved by replacement of 1-20% by mole of the group $Ar_2$ in the repeating unit represented by general formula (2) of the silicone unit-containing polyimide with a divalent aromatic group which has a functional group reactive with an epoxy group represented by the following general formula (3) and this procedure may be carried out either together with or in place of addition of an epoxy resin curing agent.

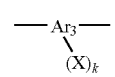

(3)

In general formula (3), $Ar_3$ is a trivalent or tetravalent aromatic group, X is a hydroxyl group, an amide group, a carboxyl group, or a mercapto group, and k is 1 or 2.

The acenaphthylene-modified epoxy resin is preferably an epoxy resin containing a structure represented by the following general formula (4) or (5).

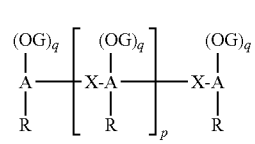

(4)

In general formula (4), A is a naphthalene nucleus, G is a glycidyl group, R is an acenaphthenyl group or a hydrogen atom, X is an alkylene group or an aralkylene group represented by —Y—Ar—Y—, p is in the range of 0-15, q is 1 or 2; the acenaphthenyl group accounts for 10% by mole or more of R, Y is an alkylene group, and Ar is a divalent aromatic group.

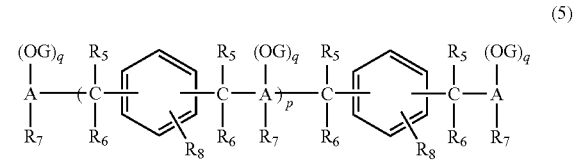

(5)

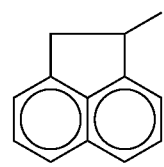

(a)

In general formula (5), A is a naphthalene nucleus, G is a glycidyl group, $R_5$, $R_6$, and $R_8$ each is a hydrogen atom or an alkyl group of 1-6 carbon atoms, $R_7$ is an acenaphthenyl group represented by the aforementioned formula (a) or a hydrogen atom and the acenaphthenyl group accounts for 10% by mole or more of $R_7$, p is in the range of 0-15, and q is 1 or 2.

Further, this invention relates to a flame-retardant adhesive film prepared by converting any one of the aforementioned flame-retardant adhesive resin compositions into a film.

It is preferable for the aforementioned flame-retardant adhesive resin composition to be substantially free from halogens and phosphorus.

PREFERRED EMBODIMENTS OF THE INVENTION

A detailed description of this invention is given below, first on a flame-retardant adhesive resin composition and then on a flame-retardant adhesive film and method of use thereof, and the topics common to both are described at the same time. First, the components constituting the flame-retardant adhesive resin composition of this invention are described.

The flame-retardant adhesive resin composition of this invention comprises 65-98% by weight of a silicone unit-containing polyimide resin constituted of a repeating unit represented by the aforementioned general formula (1) and a repeating unit represented by the aforementioned general formula (2) at a molar ratio of the repeating unit represented by formula (1) to the repeating unit represented by formula (2) in the range of 50/50 to 10/90 (hereinafter referred to as a silicone unit-containing polyimide resin) and 2-35% by weight of an acenaphthylene-modified epoxy resin that has a structure obtained by epoxidizing a naphthol resin whose naphthalene ring is substituted with an acenaphthenyl group (hereinafter referred to as an acenaphthylene-modified epoxy resin). Furthermore, this flame-retardant adhesive resin composition is preferably substantially free of halogens and phosphorus. Here, the phrase "substantially free of halogens and phosphorus" means that the content of halogens or phosphorus and the content of halides or phosphorus compounds do not become 900 ppm or above by weight as halogen element or phosphorus element.

The aforementioned silicone unit-containing polyimide resin is preferably formable into a film with ease and soluble in solvents. Furthermore, an intentional introduction of a functional group reactive with an epoxy group into the polyimide resin can make incorporation of an epoxy resin curing agent in the composition unnecessary or reduce the amount of an epoxy resin curing agent to be incorporated. A polyimide resin having a functional group reactive with an epoxy group can be obtained, for example, by selecting an aromatic diamine as a raw material properly so that 1-20% by mole, preferably 2-10% by mole, of $Ar_2$ in the aforementioned general formula (2) in the product polyimide resin is replaced by a functional group represented by the aforementioned general formula (3).

A silicone unit-containing polyimide resin can usually be prepared by the reaction of a diaminosiloxane and an aromatic diamine with a tetracarboxylic acid dianhydride. The group $A_1$ in the aforementioned general formulas (1) and (2) is regarded as the residue of the tetracarboxylic acid dianhydride used in the reaction, therefore, the nature of $Ar_1$ can be understood from an account of the tetracarboxylic acid dianhydride used. Further, the silicone unit in general formula (1) is regarded as the residue of the diaminosiloxane used in the reaction, therefore, the nature of the silicone unit can be understood from an account of the diaminosiloxane used. Still further, the group $Ar_2$ in general formula (2) is regarded as the residue of the aromatic diamine, therefore, the nature of $Ar_2$ can be understood from an account of the aromatic diamine used.

Examples of preferable tetracarboxylic acid dianhydrides include one kind or more of acid dianhydrides selected from 3,3',4,4'-diphenyl ether tetracarboxylic acid dianhydride, 3,3',4,4'-diphenyl sulfone tetracarboxylic acid dianhydride, 3,3',4,4'-benzophenonetetracarboxylic acid dianhydride, and 2,2',3,3'-benzophenonetetracarboxylic acid dianhydride. Additional examples include 3,3',4,4'-biphenyltetracarboxylic acid dianhydride, 2,3,3',4'-biphenyltetracarboxylic acid dianhydride, pyromellitic acid dianhydride, 1,4,5,8-naphthalenetetracarboxylic acid dianhydride, 1,2,5,6-naphthalenetetracarboxylic acid dianhydride, 3,4,9,10-perylenetetracarboxylic acid dianhydride, 2,3,6,7-anthracenetetracarboxylic acid dianhydride, 1,2,7,8-phenanthrenetetracarboxylic acid dianhydride, and 4,4'-(hexafluoroisopropylidene)diphthalic acid dianhydride. When a tetracarboxylic acid dianhydride to be used is selected from the aforementioned additional examples, it is preferably used together with one kind or more of the tetracarboxylic acid dianhydrides first cited above and, in such a case, the amount to be used is preferably in the range of 5-50% by mole of the whole tetracarboxylic acid dianhydrides.

The diaminosiloxane to be used in this invention is preferably represented by the following general formula (6).

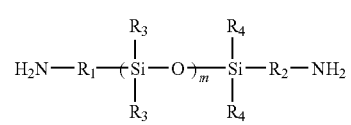

(6)

In general formula (6), the groups $R_1$ to $R_4$ have the same meaning as in general formula (1).

The groups $R_1$ and $R_2$ each is a divalent hydrocarbon group, preferably an alkylene group of 1-6 carbon atoms or a phenylene group; $R_3$ and $R_4$ each is a hydrocarbon group of 1-6 carbon atoms, preferably an alkyl group of 1-6 carbon atoms or a phenyl group. These groups may be identical with or different from one another.

The number m is in the range of 1-20, preferably in the range of 2-14 on the average. When m is outside of the lower limit of this range, the filling ability of a flame-retardant adhesive film deteriorates. On the other hand, when m is larger than the upper limit of this range, the adhesive properties deteriorate. This holds true for the silicone unit in general formula (1).

A silicone unit-containing polyimide resin prepared with the use of a diaminosiloxane gives fluidity to a flame-retardant adhesive film of this invention during heat contact bonding and improves the filling ability to a printed circuit board surface.

Preferable examples of the diaminosiloxanes are given below.

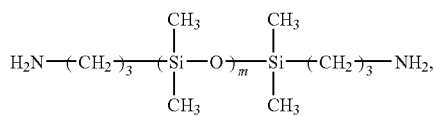

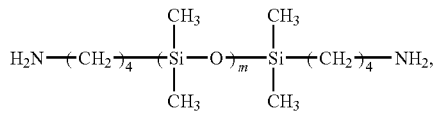

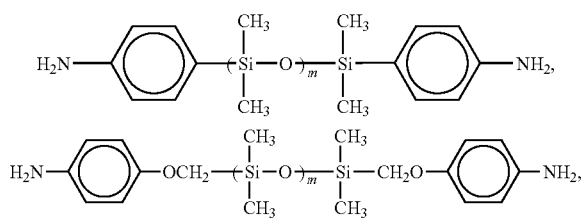

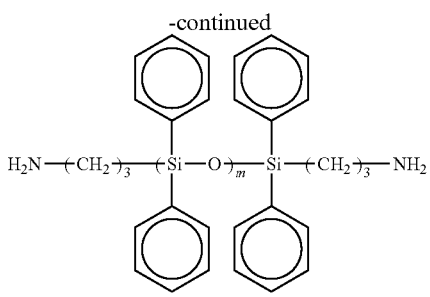

More preferable examples of the diaminosiloxanes are phenyl-substituted diaminosiloxanes shown by general structural formulas below. The sum of j and n in the formulas is in the range of 1-20, preferably in the range of 2-14.

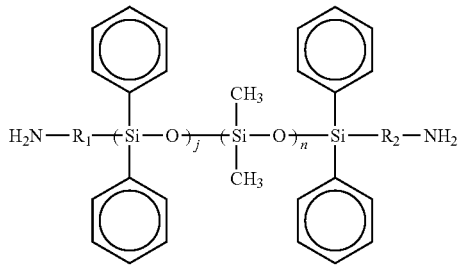

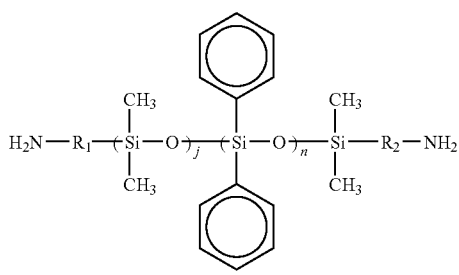

Examples of the aromatic diamines which yield $Ar_2$ in general formula (2) include m-phenylenediamine, p-phenylenediamine, 4,4'-diaminodiphenylpropane, 4,4'-diaminodiphenylmethane, benzidine, 4,4'-diaminodiphenyl sulfide, 4,4'-diaminodiphenyl sulfone, 3,3'-diaminodiphenyl sulfone, 4,4'-diaminodiphenyl ether, 3,3'-diaminodiphenyl ether, and 4,4'-diamino-p-terphenyl. For the purpose of improving the solubility of aromatic diamines in solvents, it is preferable to use one kind or more of diamines having three or more aromatic rings such as 2,2-bis(3-aminophenoxyphenyl)propane, 2,2-bis(4-aminophenoxyphenyl)propane, 3,3-bis(3-aminophenoxyphenyl)sulfone, 4,4-bis(3-aminophenoxyphenyl)sulfone, 3,3-bis(4-aminophenoxyphenyl)sulfone, 4,4-bis(4-aminophenoxyphenyl)sulfone, 2,2-bis(3-aminophenoxyphenyl)hexafluoropropane, 2,2-bis(4-aminophenoxyphenyl)hexafluoropropane, 1,4-bis(4-aminophenoxy)benzene, 1,3-bis(4-aminophenoxy)benzene, 4,4-(p-phenylenediisopropylidene)bisaniline, and 4,4-(m-phenylenediisopropylidene)bisaniline. The aromatic diamines yielding $Ar_2$ do not contain a silicone unit or a siloxane unit.

It is advantageous to use an aromatic diamine having a functional group reactive with an epoxy resin represented by the following general formula (7) as a part of the aforementioned aromatic diamines.

(7)

In general formula (7), $Ar_3$, X, and k have the same meaning as in general formula (3). Examples of such reactive aromatic diamines include 2,5-diaminophenol, 3,5-diaminophenol, 4,4'-(3,3'-dihydroxy)diaminobiphenyl, 4,4'-(2,2'-dihydroxy)diaminobiphenyl, 2,2'-bis(3-amino-4-hydroxyphenyl)hexafluoropropane, 3,3',4,4'-biphenyltetraamine, 3,3',4,4'-tetraminodiphenyl ether, 4,4'-(3,3'-dicarboxy)diphenylamine, and 3,3'-dicarboxy-4,4'-diaminodiphenyl ether particularly preferable is at least one of 4,4'-(3,3-dihydroxy)diphenylamine and 4,4'-(2,2'-dihydroxy)diphenylamine. A reactive aromatic diamine contributes to form a crosslinked structure by reacting with an epoxy resin during heat contact bonding and this further improves the adhesive strength and chemical resistance of the adhesive film of this invention. The reactive aromatic diamine is used in an amount corresponding to 1-20% by mole, preferably 2-10% by mole, of the whole aromatic diamines.

A silicone unit-containing polyimide resin constituted of repeating units represented by the aforementioned formulas (1) and (2) can be prepared by reacting the aforementioned diaminosiloxane and aromatic diamine with a tetracarboxylic acid dianhydride in a solvent to give a precursor resin and heating the precursor resin to effect ring closure. The molar ratio of the repeating unit represented by formula (1) to the repeating unit represented by formula (2) is controlled to fall in the range of 50/50 to 10/90, preferably in the range of 50/50 to 20/80, in the course of the reaction. The effect of this invention cannot be produced when the molar ratio is outside this range.

An acenaphthylene-modified epoxy resin is used as an epoxy resin. Acenaphthylene reacts with naphthalene ring to give a product having a skeleton of acenaphthenyl-substituted naphthalene and this contributes to improve the flame retardance of the adhesive resin composition of this invention.

An acenaphthylene-modified epoxy resin is prepared by first reacting a naphthol resin, preferably a naphthol novolak resin, with acenaphthylene to give an acenaphthylene-modified naphthol resin having a structure of a naphthalene ring (naphthol ring) substituted with an acenaphthenyl group and then converting the OH group of the naphthol resin to an OG group (a glycidyl ether group) by epoxidation with epichlorohydrin. However, the method for preparing an acenaphthylene-modified epoxy resin is not limited to the one described above.

A preferable example of the acenaphthylene-modified epoxy resin is an epoxy resin represented by the aforementioned general formula (4). In general formula (4), A is a naphthalene nucleus, G is a glycidyl group, R is an acenaphthenyl group or a hydrogen atom, X is an alkylene group or an aralkylene group represented by —Y—Ar—Y—, p is in the range of 0-15, q is 1 or 2, and the proportion of the acenaphthenyl group in R is 10% by mole or more. Further, Y is an alkylene group and Ar is a divalent aromatic group. In the case where X and Y each is an alkylene group, each is preferably an alkylene group of 1-3 carbon atoms, more preferably a methylene group. The group X is derived from a crosslinking agent to be reacted with naphthol in the preparation of a naphthol resin. Where the crosslinking agent is formalin, X is a methylene group. Where the crosslinking agent is a compound represented by RO—$H_2$C-Ph-$CH_2$—OR (wherein R is H or an alkyl group and Ph is a phenylene group), X is an aralkylene group represented by —$H_2$C-Ph-$CH_2$—. The group Ar is a divalent aromatic group, preferably a phenylene group or a biphenylene group. The group A is a naphthalene nucleus and at least 10% by mole, preferably 30% by mole or more, more preferably 40% by mole or more, of the total naphthalene nuclei is substituted with acenaphthenyl groups. When the rate of substitution is lower than this, sufficient flame retardance cannot be obtained. Since the epoxy resin is a mixture, it is satisfactory when 10 moles or more of the acenaphthenyl group is present per 100 moles of the total naphthalene nuclei in the epoxy resin as a whole. It is allowable to substitute 80% by mole or more with the acenaphthenyl group, but the effect of substitution becomes saturated. Thus, it is adequate to set the rate of substitution in the range of 20-80% by mole, preferably in the range of 30-70% by mole. The number p is in the range of 0-15 and the average of p is in the range of 0-5, preferably in the range of 0.1-3. The number q is 1 or 2, preferably 1.

A preferable example of acenaphthylene-modified epoxy resins is an epoxy resin represented by the aforementioned formula (5). In formula (5), A is a naphthalene nucleus, G is a glycidyl group, $R_5$, $R_6$, and $R_8$ each is a hydrogen atom or an alkyl group of 1-6 carbon atoms, $R_7$ is the acenaphthenyl group shown by formula (a) or a hydrogen atom, p is in the range of 0-15, and q is 1 or 2. It is to be understood that, wherever the same symbol is used in formulas (4) and (5), they have the same meaning. The rate of substitution of the acenaphthenyl group is 10% by mole or more, preferably 30% by mole or more.

An account is given for a method of preparing an acenaphthylene-modified epoxy resin below. The Friedel-Crafts reaction is applicable to acenaphthylene, which is a kind of aromatic olefin, to effect its addition to the naphthalene rings of a naphthol resin, although a candidate method is not limited to this particular reaction. The resulting naphthol resin which has a skeleton of acenaphthenyl-substituted naphthalene can be made epoxy resin by reacting with epichlorohydrin according to a known method. The naphthol resins useful here include naphthol novolak resins and naphthol aralkyl resins and naphthol aralkyl resins are preferred from the viewpoint of moisture resistance and impact resistance. Such acenaphthylene-modified epoxy resins can be prepared, for example, by the method disclosed in the patent document 5.

The acenaphthylene-modified epoxy resin in which acenaphthylene is added to a naphthalene nucleus of the naphthol structure at a rate of 0.1 or more, preferably 0.3 or more, more preferably 0.4 or more on an average, of acenaphthylene to one naphthalene nucleus is preferable and some naphthalene nuclei in the resin may be allowed to remain unsubstituted with acenaphthenyl groups. In the case where a naphthol aralkyl resin is used in the reaction, there is a possibility of acenaphthylene reacting not only with the naphthalene nuclei but also partly with the benzene rings of the aralkyl moiety; however, this will produce no adverse effect.

The acenaphthylene-modified epoxy resin preferably has a structure represented by the aforementioned formula (4) or (5).

Concretely, the epoxy resins represented by the following formulas are preferable.

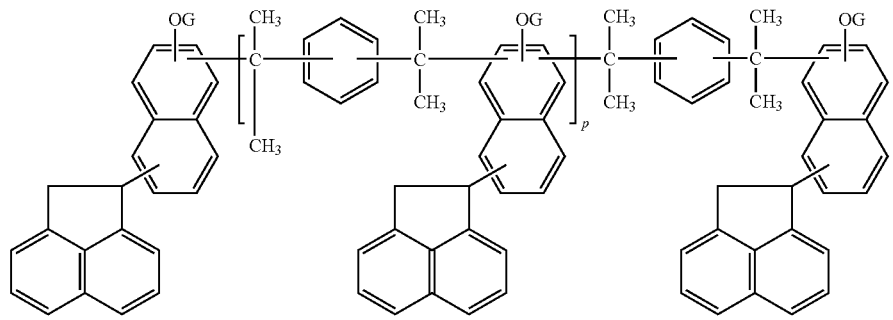

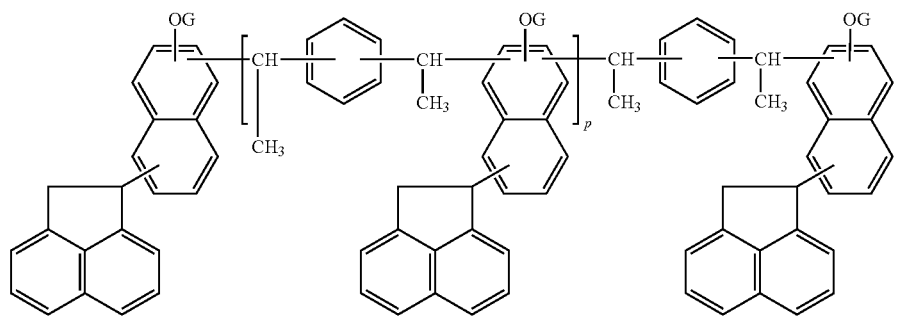

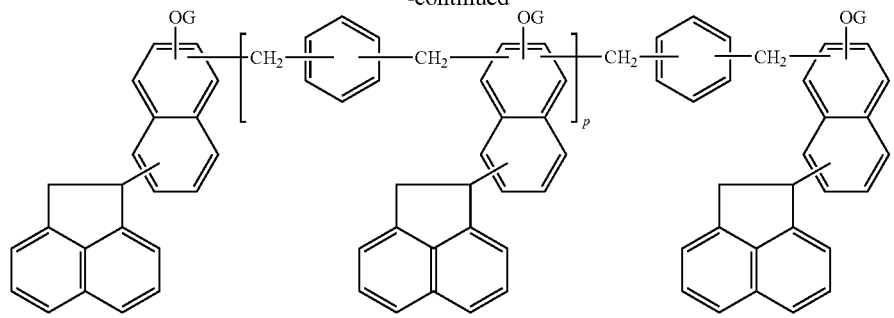
More concretely, the naphthalene-based epoxy resins represented by the following formulas are preferable.
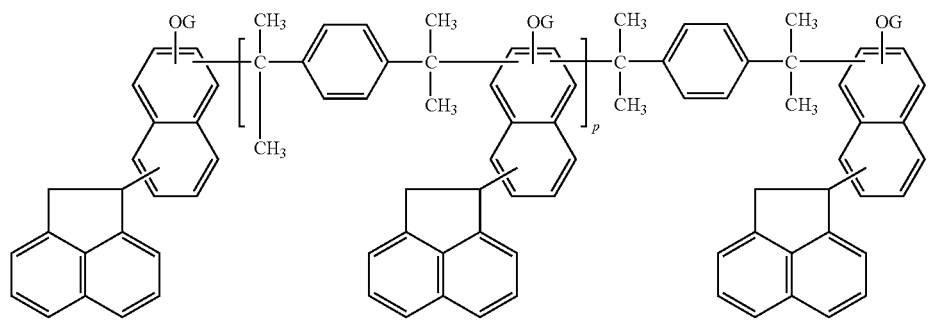
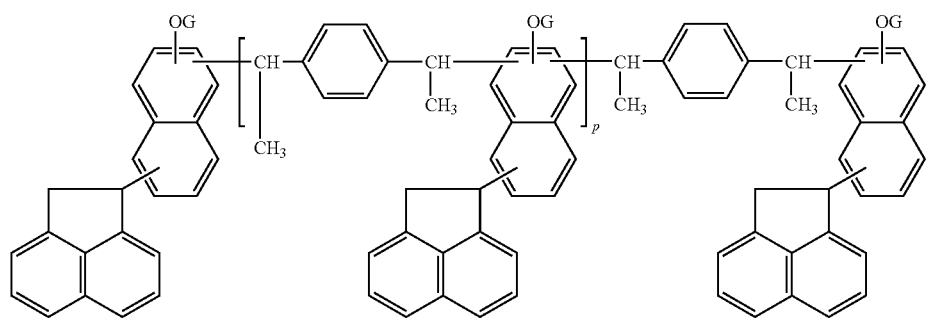
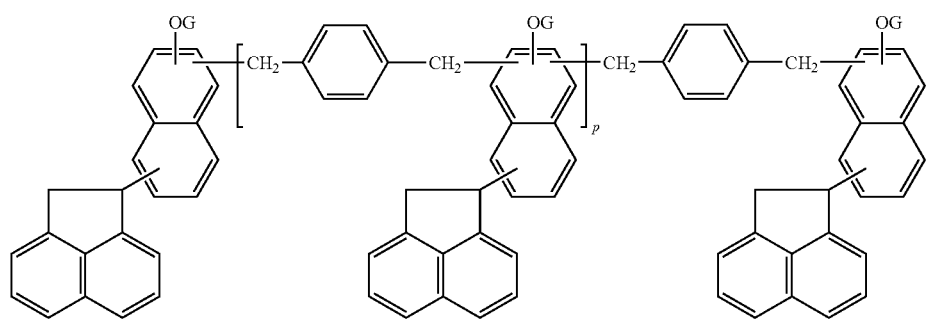

The ratio of a silicone unit-containing polyimide resin to an acenaphthylene-modified epoxy resin is 65-98% by weight of the former to 2-35% by weight of the latter, preferably 70-90% by weight of the former to 10-30% by weight of the latter. A mixture of the two in this range can further improve the heat resistance and adhesive properties without deteriorating the properties characteristic of polyimide resins.

The resin composition of this invention for forming an adhesive or a film comprises the aforementioned essential components and it is allowable to incorporate an epoxy resin curing agent in the composition. In this case, the epoxy resin curing agent is incorporated at a rate of 1-15% by weight, preferably 5-10% by weight, of the sum of the aforementioned polyimide resin and epoxy resin. Another way of stating the case is that the epoxy resin curing agent is incorporated preferably at a rate of 20-70% by weight of the epoxy resin. The use of an epoxy resin curing agent is effective in the case where a silicone unit-containing polyimide resin has no functional group represented by the aforementioned general formula (3) in the molecule. In order to fully display the effect of this invention, it is preferable to select an epoxy resin curing agent which is free from halogens and phosphorus.

Examples of the epoxy resin curing agents include phenols such as phenol novolak, o-cresol novolak, and phenol resol, naphthols, amines such as diethylenetriamine, and acid anhydrides such as pyromellitic dianhydride and phthalic anhydride.

It is allowable to incorporate, if necessary, known curing accelerators, coupling agents, fillers, pigments, and the like in the adhesive resin composition of this invention in addition to the aforementioned components and it is further allowable to incorporate a small amount of polyimide resins and epoxy resins other than silicone unit-containing polyimide resins and acenaphthylene-modified epoxy resins to the extent that such incorporation does not harm the effect of this invention. It is preferable that such other resins are free from halogens and phosphorus.

The flame-retardant adhesive resin composition of this invention can be used in the form of a film. Although the composition can be formed into a film by a known method, an advantageous method comprises dissolving the composition in a solvent, applying the solution to a metal foil which is surface-treated with a release agent or to a release film made of polyester or polyimide, evaporating the solvent until the surface becomes tack-free, drying the remaining resin composition to form a film at a given temperature for a given period of time without causing the composition to cure, and peeling off the film from the metal foil or release film. Although the drying conditions vary with the solvent and the composition used, the temperature is usually set at 130-160° C. and the time at 3-10 minutes. The ratio of thickness of the release film such as polyester and the flame-retardant adhesive film layer is not limited and it is preferably set at 12.5 μm for the release film and at 15-30 μm for the adhesive film layer.

Typical solvents useful for the aforementioned film-forming process include amide-based solvents such as N,N-dimethylformamide, N,N-diethylformamide, N,N-dimethylacetamide, N,N-diethylacetamide, N,N-dimethylmethoxyacetamide, dimethyl sulfoxide, and N-methyl-2-pyrrolidone and solvents based on ethers, esters, and alcohols such as tetrahydrofuran, diethylene glycol dimethyl ether, diethylene glycol diethyl ether, dioxane, γ-butyrolactone, xylenol, phenol, methyl cellosolve, ethyl cellosolve, methyl cellosolve acetate, ethyl cellosolve acetate, toluene, xylene, and methyl ethyl ketone. The solvent used in the preparation of the aforementioned polyimide resin may be used as it is in the film-forming process without ill effect.

The flame-retardant adhesive film of this invention is suitable for use in bonding of a variety of adherends such as a laminate for a flexible printed circuit board substrate, a glass fiber-epoxy printed circuit board substrate, or a paper-phenol printed circuit board substrate, various printed circuit boards fabricated from the foregoing substrates, metals, and resin base materials. Bonding of a metal foil to a resin base material gives a laminate for a printed circuit board substrate, bonding of a laminate to a laminate or a printed circuit board to a printed circuit board gives a laminate for a multiplayer printed circuit board substrate or a multiplayer printed circuit board, and bonding of a printed circuit board to a coverlay film gives a printed circuit board equipped with a coverlay film. The flame-retardant adhesive film is also used for connection of a laminate for a printed circuit board substrate or of printed circuit boards. At any rate, the adhesive is used advantageously in the manufacture or fabrication of printed circuit board substrates.

In bonding of adherends by the use of the flame-retardant adhesive film of this invention, the film is inserted between two adherends, contact-bonded at a temperature of 20-250° C. and a pressure of 1-100 kg/cm$^2$, and preferably further heated at 50-250° C. for a given period of time to cure the epoxy resin completely thereby forming an adhesive layer between the adherends.

EXAMPLES

The properties were evaluated as follows in the examples unless otherwise noted.

Measurement of Tensile Strength

The tensile strength of an adhesive film was measured by cutting a strip-shaped test specimen measuring 12.5 mm×120 mm from the film, making a measurement using a tensile tester (Strograph R1 manufactured by Toyo Seiki Seisaku-sho, Ltd.) at a crosshead speed of 25 mm/min and a distance between chucks of 101.6 mm, and taking the value obtained by dividing the measured load by the cross-sectional area (0.31 mm$^2$) of the test specimen as the tensile strength.

Measurement of Glass Transition Temperature (Tg)

The glass transition temperature was measured using a thermomechanical analyzer (4000SA manufactured by Bruker) by heating a test specimen measuring 2×30 mm at a distance between chucks of 15 mm while applying a load of 2 kg and raising the temperature at a rate of 5° C./min, measuring the thermal expansion in the lengthwise direction of the test specimen, and taking the point of inflection as Tg.

Measurement of Adhesive Strength

The adhesive strength was measured using a tensile tester (Strograph M1 manufactured by Toyo Seiki Seisaku-sho, Ltd.) by cutting a test specimen measuring 10×100 mm from the film, sandwiching the test specimen between two 35 μm-thick copper foils with the glossy surfaces of both foils facing the film, further sandwiching the copper-clad film between two polyimide films (Apical NPI manufactured by Kaneka Corporation), contact-bonding at 180° C. and 40 kg/cm$^2$ for 60 minutes, peeling the film in a 180° direction at a rate of 50 mm/min, and taking the force required for peeling as the adhesive strength. The adhesive strength 1 is an adhesive strength against the copper foil while the adhesive strength 2 is an adhesive strength against the polyimide film.

Measurement of Specific Permittivity

The specific permittivity was measured by using a test specimen prepared by thermal curing at a temperature of 180° C. and a pressure of 40 kg/cm$^2$ for 60 minutes, printing an electrode pattern of JIS C-6481 on both sides of the test specimen with a silver paste, leaving the printed test specimen standing at a temperature of 25° C. and a relative humidity of 50% for 24 hours, and measuring the specific permittivity at 1 Hz using an apparatus for automatic measurement of the dielectric loss (TR-1100 manufactured by Ando Electric Co., Ltd.).

Measurement of Volume Resistivity

The volume resistivity was measured in accordance with JIS C-2330.

Measurement of Thermal Decomposition Temperature

The temperature at which the loss in weight is 5% is measured in an atmosphere of nitrogen using TG/DTA6200 manufactured by SII and is taken as the thermal decomposition temperature.

Method for Evaluating Solder Heat Resistance

A test specimen measuring 10×100 mm is inserted between two 35 μm-thick copper foils with the glossy surface facing the test specimen and contact-bonded at a temperature of 180° C. and a pressure of 40 kg/cm² for 60 minutes. The copper-clad test piece is left standing at a temperature of 25° C. and a relative humidity of 50% for 24 hours, then immersed in a solder bath maintained at a prescribed evaluation temperature, and the condition of adhesion is observed to confirm the presence of absence of undesirable phenomena such as foaming, blistering, and peeling. In the column for solder heat resistance in Table 3, "300° C." means that no undesirable phenomenon was observed when tested in a solder bath of 300° C.

Method for Evaluating Fire Resistance

The fire resistance is evaluated according to the classifications in the burning test specified by UL-94 and is judged in two levels, "VTM-0" (which means the presence of fire resistance) and "no fire resistance."

This invention is described below concretely with reference to the examples, but it is not limited to these examples.

The abbreviations used in the examples refer to the following compounds.

ODPA: 3,3',4,4'-Diphenyl ether tetracarboxylic acid dianhydride
DSDA: 3,3',4,4'-Diphenyl sulfone tetracarboxylic acid dianhydride
BTDA: 3,3',4,4'-Benzophenonetetracarboxylic acid dianhydride
BPDA: 3,3',4,4'-Biphenyltetracarboxylic acid dianhydride
BAPP: 2,2'-Bis(4-aminophenoxyphenyl)propane
BAPS: Bis(4-aminophenoxyphenyl)sulfone
mBAPS: Bis(3-aminophenoxyphenyl)sulfone
BisAM: 1,3-Bis(aminoisopropyl)benzene
DABP: 3,3'-Diaminobenzophenone
HAB: 4,4'-(3,3'-Dihydroxy)diaminobiphenyl
oDAP: 2,5-Diaminophenol
HFP: 2,2'-Bis(3-amino-4-hydroxyphenyl)hexafluoropropane
TCP: Tricresyl phosphate
TPP: Triphenyl phosphate
DOP: Di(2-ethylhexyl)phthalate
PPA: Polypropylene adipate
DOS: Di(2-ethylhexyl)sebacate
PSX-A, PSX-B, PSX-C, and PSX-D: Diaminosiloxane represented by the following formula (8) wherein the average of m is in the range of 1-20; the average molecular weight is 740 for PSX-A, 1,000 for PSX-B, 1,240 for PSX-C, and 2,000 for PSX-D.
PSX-Ph: Diaminosiloxane represented by the following formula (9) wherein the average of the sum of j and n is in the range of 2-20, j and n each is 1 or more, and the average molecular weight is 1,320.
NA resin: 1-Naphthol aralkyl resin represented by the following formula (10) (SN-485 manufactured by Nippon Steel Chemical Co., Ltd.).

Synthetic Example 1

An addition reaction of 20 g of acenaphthylene to 180 g of NA resin was carried out at 100° C. with stirring in a 500-ml separable flask to give 200 g of an acenaphthylene-modified naphthol aralkyl resin. The acenaphthylene-modified naphthol aralkyl resin showed a softening point of 54° C. when measured in accordance with JIS K 2548 and a hydroxyl equivalent (OH equivalent) of 236. The degree of addition reaction determined by GPC was 99% and the rate of substitution of the acenaphthenyl group (the number of moles of acenaphthylene added to 1 mole of naphthalene ring) was 0.4.

Synthetic Example 2

In 400 g of epichlorohydrin was dissolved 100 g of the acenaphthylene-modified naphthol resin obtained above and the two were allowed to react at a reduced pressure of 100 mmHg and at 60° C. for 5 hours while adding 40 g of a 50% aqueous sodium hydroxide solution over a period of 4 hours. The water formed in the reaction was removed out of the system by azeotropic distillation with epichlorohydrin.

Upon completion of the reaction, the excess epichlorohydrin was distilled off under reduced pressure, 450 g of methyl isobutyl ketone was added to the residue to dissolve the epoxy resin, the solution was filtered under reduced pressure, and the epoxy resin was recovered in the filtrate. Thereafter, 20 g of a 20% aqueous sodium hydroxide solution was added and the reaction was carried out at 80° C. for 2 hours. The reaction mixture was then filtered, washed with water, and stripped of the methyl isobutyl ketone by distillation under reduced pressure to give 120 g of a brown acenaphthylene-modified epoxy resin (Modified Resin A). Modified Resin A showed a softening point of 48° C. and an epoxy equivalent of 308.

Synthetic Example 3

In a 500-ml separable flask was placed 160 g of a phenol aralkyl resin (MEH-7800-4L with an OH equivalent of 162, manufactured by Meiwa Plastic Industries, Ltd.) and the resin was melted at 100° C. To the melt was added 40 g of acenaphthylene and an addition reaction was carried out with stirring at 100° C. for 1 hour to give 200 g of an acenaphthylene-modified phenol aralkyl resin. The acenaphthylene-modified phenol aralkyl resin thus obtained showed a softening point of 59° C. when determined according to JIS K 2548 and a hydroxyl equivalent (OH equivalent) of 184. The degree of addition reaction of acenaphthylene was 99% when determined by GPC and the rate of substitution of the acenaphthenyl group was 0.4.

Synthetic Example 4

Then, 100 g of the acenaphthylene-modified phenol aralkyl resin thus obtained was dissolved in 400 g of epichlorohydrin and the reaction was carried out at a reduced pressure of 100 mmHg and at 60° C. for 5 hours while adding 40 g of a 50% aqueous sodium hydroxide solution over a period of 4 hours. The water formed in the reaction was removed out of the system by azeotropic distillation with epichlorohydrin.

Upon completion of the reaction, the excess epichlorohydrin was distilled off under reduced pressure, 450 g of methyl isobutyl ketone was added to the residue to dissolve the epoxy resin, the solution was filtered under reduced pressure, and the epoxy resin was recovered in the filtrate. Thereafter, 20 g of a 20% aqueous sodium hydroxide solution was added and the reaction was carried out at 80° C. for 2 hours. The reaction mixture was then filtered, washed with water, and stripped of the methyl isobutyl ketone under reduced pressure to give 116 g of a brown acenaphthylene-modified phenolic epoxy resin (Modified Resin B). Modified Resin B showed a softening point of 52° C. and an epoxy equivalent of 303.

Synthetic Example 5

An addition reaction of 180 g of NA resin and 39 g of indene was carried out in a 500-ml separable flask at 100° C. for 1 hour to give 218 g of an indenyl-substituted naphthol aralkyl resin. The indene-modified naphthol aralkyl resin thus obtained showed a softening point of 107° C. when determined in accordance with JIS K 2584 and a hydroxyl equivalent (OH equivalent) of 261. The degree of addition reaction of acenaphthylene was 99% when determined by GPC and the rate of substitution of the indenyl group was 0.4.

Synthetic Example 6

Then, 100 g of the indenyl-modified naphthol aralkyl resin thus obtained was dissolved in 285 g of epichlorohydrin and the reaction was carried out at a reduced pressure of 100 mmHg and at 60° C. for 5 hours while adding 35 g of a 50% aqueous sodium hydroxide solution over a period of 4 hours. The water formed in the reaction was removed out of the system by azeotropic distillation with epichlorohydrin.

Upon completion of the reaction, the excess epichlorohydrin was distilled off under reduced pressure, 285 g of methyl isobutyl ketone was added to the residue to dissolve the epoxy resin, and sodium chloride was removed by washing with water. Thereafter, 20 g of a 20% aqueous sodium hydroxide solution was added and the reaction was carried out at 80° C. for 2 hours. The reaction mixture was then filtered, washed with water, and stripped of the methyl isobutyl ketone under reduced pressure to give 110 g of a brown indene-modified naphtholic epoxy resin (INPT). INPT showed a softening point of 95° C. and an epoxy equivalent of 320.

Synthetic Example 7

An addition reaction of 180 g of NA resin and 35 g of styrene was carried out in a 500-ml separable flask at 140° C. with stirring for 1 hour to give 213 g of a styrenyl-substituted naphthol aralkyl resin. The styrene-modified naphthol aralkyl resin thus obtained showed a softening point of 88° C. when determined in accordance with JIS K 2548 and a hydroxyl equivalent (OH equivalent) of 258. The degree of addition reaction of styrene was 99% when determined by GPC and the rate of substitution of the styrenyl group was 0.4.

Synthetic Example 8

Then, 100 g of the styrene-modified naphthol aralkyl resin thus obtained was dissolved in 290 g of epichlorohydrin and the reaction was carried out at a reduced pressure of 100 mmHg and at 60° C. for 5 hours while adding 36 g of a 50% aqueous sodium hydroxide solution over a period of 4 hours. The water formed in the reaction was removed out of the system by azeotropic distillation with epichlorohydrin.

Upon completion of the reaction, the excess epichlorohydrin was distilled off under reduced pressure, 285 g of methyl isobutyl ketone was added to the residue to dissolve the epoxy resin, and sodium chloride was removed by washing with water. Thereafter, 20 g of a 20% aqueous sodium hydroxide solution was added and the reaction was carried out at 80° C. for 2 hours. The reaction mixture was then filtered, washed with water, and stripped of the methyl isobutyl ketone under reduced pressure to give 109 g of a brown styrene-modified naphtholic epoxy resin (STNPT). STNPT showed a softening point of 75° C. and an epoxy equivalent of 317.

Synthetic Example 9

In a 1,000-ml separable flask were placed 50.16 g (0.14 mole) of DSDA, 200 g of N-methyl-2-pyrrolidone, and 200 g of xylene and mixed thoroughly at room temperature. Then, 31.54 g (0.0434 mole) of PSX-A was added dropwise to the mixture from a dropping funnel, the resulting reaction solution was ice-cooled with stirring, 37.36 g (0.091 mole) of BAPP and 1.30 g (0.006 mole) of HAB were added, and the mixture was stirred at room temperature for 2 hours to give a polyamic acid solution. The polyamic acid solution was heated to 190° C. and kept at this temperature for 20 hours with stirring to give a polyimide solution a showing a logarithmic viscosity of 0.9 dl/g.

Synthetic Examples 10-21

Polyimide solutions b-m were prepared as in Example 1 from the compositions shown in Table 1.

TABLE 1

| Synthetic Ex. | Polyimide solution | Tetracarboxylic acid (mole) | Diamine (mole) | | Diaminosiloxane (mole) |
|---|---|---|---|---|---|
| 9  | a | DSDA 0.14 | BAPP 0.091 | HAB 0.006 | PSX-A 0.0434 |
| 10 | b | ODPA 0.11 | BAPP 0.07 | HAB 0.004 | PSX-A 0.036 |
| 11 | c | ODPA 0.11 | BAPP 0.07 | HAB 0.005 | PSX-Ph 0.035 |
| 12 | d | DSDA 0.11 | BAPP 0.07 | HAB 0.005 | PSX-Ph 0.035 |
| 13 | e | DSDA 0.13 | mBAPS 0.07 | HFP 0.004 | PSX-A 0.056 |
| 14 | f | DSDA 0.11 | BisAM 0.07 | HAB 0.005 | PSX-A 0.035 |
| 15 | g | BPDA 0.11 | BisAM 0.07 | HAB 0.005 | PSX-A 0.035 |
| 16 | h | BTDA 0.12 | mBAPS 0.06 | HAB 0.005 | PSX-A 0.055 |
| 17 | i | ODPA 0.11 | BAPP 0.074 | HAB 0.004 | PSX-B 0.032 |
| 18 | j | ODPA 0.11 | BAPP 0.078 | HAB 0.004 | PSX-C 0.028 |
| 19 | k | ODPA 0.11 | BAPP 0.081 | HAB 0.004 | PSX-D 0.025 |
| 20 | l | DSDA 0.12 | BAPP 0.07 | HAB 0.004 | PSX-A 0.046 |
| 21 | m | DSDA 0.12 | BAPP 0.07 | HAB 0.004 | PSX-Ph 0.046 |

Example 1

A mixture of 70 parts by weight (as solid) of polyimide solution a obtained in Synthetic Example 9 and 30 parts by weight of Modified Resin A obtained in Synthetic Example 2 was stirred at room temperature for 2 hours to prepare an adhesive resin solution (resin composition). The resin solution was applied to a glass plate and dried to form a film to be used as an adhesive film. The film showed a glass transition temperature of 185° C., a tensile strength of 74 MPa, a specific permittivity of 2.9, a volume resistivity of $2 \times 10^{15}$ Ωcm, an adhesive strength of 1.4 kN/m, and a thermal decomposition temperature of 460° C. When evaluated for the solder heat resistance, the film gave good results without such undesirable phenomena as blistering and peeling. The results are shown in Tables 2 and 3.

A flexible printed circuit board was prepared by forming a circuit (line/space=0.15 mm/0.15 mm) on both copper foils sandwiching a polyimide film. The adhesive film obtained in Example 1 was inserted between two such flexible printed circuit board, the assembly was contact-bonded at 180° C. and 25 kgf/cm² for 60 minutes, and the cross section of the bonded assembly was observed. No air bubble remained between the circuits and good filling ability to the circuits was indicated. Likewise, the same procedure was followed and a through-hole was drilled in the contact-bonded assembly to form a multiplayer printed circuit board. A good through-hole was obtained without generation of smears.

Examples 2-11

Polyimide solutions were prepared as in Example 1 from the compositions shown in Table 1 and resin compositions were prepared from the compositions shown in Table 2 and formed into films. The properties of the films were determined and shown in Tables 2 and 3. Wherever an epoxy resin curing agent was used, it was a naphthol resin (ESN-485 manufactured by Tohto Kasei Co., Ltd.). The acenaphthylene-modified epoxy resin (Modified Resin A) obtained in Synthetic Example 2 was used as an epoxy resin.

Comparative Examples 1-10

Polyimide solutions were prepared from the compositions shown in Table 1 and resin compositions were prepared from the compositions shown in Table 2 and formed into films in the same manner as in the examples. The properties of the films were determined and shown in Tables 2 and 3.

The epoxy resins used in the comparative examples are shown by their abbreviations in Table 2 as follows: DGEBA is an epoxy resin obtained by converting bisphenol A to its glycidyl ether (Epikote 828 manufactured by Japan Epoxy Resins Co., Ltd.); oCNB is an epoxy resin obtained by converting an o-cresol novolak resin to its glycidyl ether (EOCN-1020 manufactured by Nippon Kayaku Co., Ltd.); INPT is the indene-modified naphtholic epoxy resin obtained in Synthetic Example 6; STNPT is the styrene-modified naphtholic epoxy resin obtained in Synthetic Example 8; A is Modified Resin A obtained in Synthetic Example 2; and B is Modified Resin B obtained in Synthetic Example 4.

TABLE 2

| | Polyimide resin | | | | Thermal | | |
|---|---|---|---|---|---|---|---|
| | Solution | Solid content (wt %) | Epoxy resin (wt %) | ESN-485 (wt %) | decomposition temperature (° C.) | Tg (° C.) | Specific permittivity |
| Ex. | | | | | | | |
| 1 | a | 70 | 30 A | | 460 | 185 | 2.9 |
| 2 | b | 70 | 30 A | | 470 | 190 | 3.0 |
| 3 | c | 70 | 30 A | | 490 | 205 | 3.1 |
| 4 | d | 70 | 20 A | 10 | 490 | 200 | 3.1 |
| 5 | e | 70 | 30 A | | 450 | 180 | 2.9 |
| 6 | f | 70 | 30 A | | 460 | 180 | 3.0 |
| 7 | g | 70 | 30 A | | 470 | 185 | 3.1 |

TABLE 2-continued

| | Polyimide resin Solution | Solid content (wt %) | Epoxy resin (wt %) | ESN-485 (wt %) | Thermal decomposition temperature (° C.) | Tg (° C.) | Specific permittivity |
|---|---|---|---|---|---|---|---|
| 8 | h | 70 | 30 A | | 480 | 190 | 3.2 |
| 9 | i | 70 | 20 A | 10 | 485 | 185 | 3.2 |
| 10 | j | 70 | 20 A | 10 | 475 | 180 | 3.2 |
| 11 | k | 70 | 20 A | 10 | 470 | 175 | 3.3 |
| Comp. Ex | | | | | | | |
| 1 | l | 70 | 30 DGEBA | | 440 | 155 | 3.2 |
| 2 | l | 70 | 30 oCNB | | 450 | 160 | 3.3 |
| 3 | m | 70 | 30 DGEBA | | 475 | 180 | 3.4 |
| 4 | m | 70 | 30 oCNB | | 485 | 190 | 3.1 |
| 5 | l | 60 | 40 A | | 450 | 165 | 3.5 |
| 6 | m | 60 | 40 A | | 470 | 170 | 3.6 |
| 7 | l | 70 | 30 INPT | | 480 | 180 | 3.2 |
| 8 | l | 70 | 30 STNPT | | 470 | 165 | 3.2 |
| 9 | m | 70 | 30 INPT | | 485 | 190 | 3.1 |
| 10 | m | 70 | 30 STNPT | | 475 | 180 | 3.1 |
| 11 | a | 70 | 30 B | | 440 | 155 | 3.1 |
| 12 | d | 70 | 30 B | | 460 | 170 | 3.3 |

TABLE 3

| | Tensile strength (MPa) | Volume resistivity (×10$^{15}$) (Ωcm) | Adhesive strength (kN/m) 1 | 2 | Solder heat resistance (° C.) | Fire resistance |
|---|---|---|---|---|---|---|
| Ex. | | | | | | |
| 1 | 74 | 2 | 1.4 | 0.9 | 300 | VTM-0 |
| 2 | 77 | 2 | 1.6 | 1.2 | 300 | VTM-0 |
| 3 | 80 | 3 | 1.0 | 0.7 | 300 | VTM-0 |
| 4 | 78 | 3 | 1.2 | 0.9 | 300 | VTM-0 |
| 5 | 73 | 2 | 0.9 | 0.8 | 300 | VTM-0 |
| 6 | 72 | 2 | 1.0 | 0.8 | 300 | VTM-0 |
| 7 | 74 | 2 | 0.8 | 0.6 | 300 | VTM-0 |
| 8 | 72 | 2 | 0.9 | 1.0 | 300 | VTM-0 |
| 9 | 71 | 2 | 1.1 | 0.7 | 290 | VTM-0 |
| 10 | 68 | 2 | 1.1 | 0.6 | 280 | VTM-0 |
| 11 | 67 | 2 | 1.0 | 0.8 | 270 | VTM-0 |
| Comp. Ex. | | | | | | |
| 1 | 72 | 2 | 1.2 | 1.0 | 290 | None |
| 2 | 73 | 2 | 1.3 | 1.2 | 290 | None |
| 3 | 77 | 3 | 0.9 | 0.9 | 300 | None |
| 4 | 79 | 3 | 0.9 | 1.0 | 300 | None |
| 5 | 75 | 2 | 0.9 | 0.9 | 300 | None |
| 6 | 74 | 2 | 0.7 | 0.6 | 290 | None |
| 7 | 73 | 2 | 1.0 | 1.1 | 290 | None |
| 8 | 70 | 2 | 1.0 | 1.0 | 280 | None |
| 9 | 71 | 3 | 0.9 | 0.8 | 300 | None |
| 10 | 69 | 4 | 1.0 | 0.8 | 300 | None |
| 11 | 67 | 2 | 1.1 | 1.0 | 280 | None |
| 12 | 69 | 2 | 0.9 | 0.8 | 290 | None |

INDUSTRIAL APPLICABILITY

The flame-retardant adhesive resin composition of this invention and the adhesive film using the same can be used in heat contact bonding of adherends at a temperature lower than that for the conventional polyimide-based adhesives without damaging the excellent heat resistance and electrical properties characteristic of polyimides. The composition and the film exhibit excellent flame retardance even though they do not contain halogens or phosphorus; therefore, they reduce the hazards of generating toxic substances such as dioxin and contaminating soil and water at the time of their disposal by burning. The flame-retardant adhesive resin composition of this invention and the flame-retardant adhesive film using the same is suitable for use as an adhesive for a laminate for a multilayer printed circuit board substrate, an adhesive for a hybrid circuit board substrate, and an adhesive for a coverlay film.

The invention claimed is:

1. A flame-retardant adhesive resin composition comprising a blend of a silicone unit-containing polyimide resin and an acenaphthylene-modified epoxy resin having a blend ratio of 65-98% by weight of the silicone unit-containing polyimide resin to 2-35% by weight of the acenaphthylene-modified epoxy resin;

wherein the silicone unit-containing polyimide resin is constituted of a repeating unit represented by the following general formula (1) and a repeating unit represented by the following general formula (2) at a molar ratio of the repeating unit represented by formula (1) to the repeating unit represented by formula (2) in the range of 50/50 to 10/90:

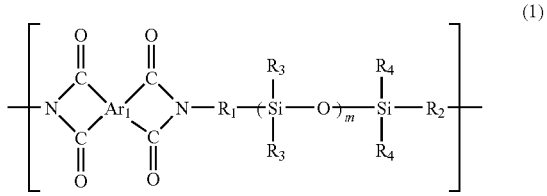
(1)

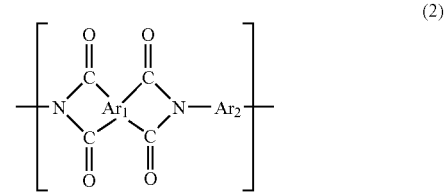
(2)

wherein in general formula (1), $Ar_1$ is a tetravalent aromatic group, $R_1$ and $R_2$ each is a divalent hydrocarbon group, $R_3$ and $R_4$ each is a hydrocarbon group of 1-6 carbon atoms, and m is a number of 1-20; and in general formula (2), $Ar_1$ is a tetravalent aromatic group and $Ar_2$ is a divalent aromatic group; and wherein the acenaphthylene-modified epoxy resin is obtained by epoxidation of a naphthol resin whose naphthalene ring is substituted with an acenaphthenyl group.

2. The flame-retardant adhesive resin composition of claim 1 further comprising 1-15 parts by weight of an epoxy resin curing agent per 100 parts by weight of the blend.

3. A fire-retardant adhesive film obtained by converting the flame-retardant adhesive composition of claim 2 into a film.

4. The flame-retardant adhesive resin composition of claim 1, wherein 1-20% by mole of $Ar_2$ in general formula (2) is a divalent aromatic group having a functional group reactive with an epoxy group represented by the following general formula (3):

(3)

wherein in general formula (3), $Ar_3$ is a trivalent or tetravalent aromatic group, X is a hydroxyl group, an amino group, a carboxyl group, or a mercapto group, and k is 1 or 2.

5. A fire-retardant adhesive film obtained by converting the flame-retardant adhesive composition of claim 4 into a film.

6. The flame-retardant adhesive resin composition of claim 1, wherein the acenaphthylene-modified epoxy resin has a structure represented by the following general formula (4):

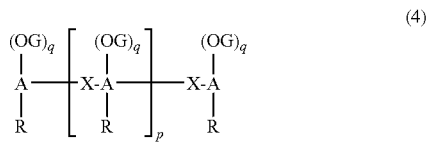

(4)

wherein in general formula (4), A is a naphthalene nucleus, G is a glycidyl group, R is an acenaphthenyl group or a hydrogen atom, X is an alkylene group or an aralkylene group represented by —Y—Ar—Y—, p is a number of 0-15, q is 1 or 2, the proportion of the acenaphthenyl group in R is 10% by mole or more, Y is an alkylene group, and Ar is a divalent aromatic group.

7. A fire-retardant adhesive film obtained by converting the flame-retardant adhesive composition of claim 6 into a film.

8. The flame-retardant adhesive resin composition of claim 6, wherein the acenaphthylene-modified epoxy resin has a structure represented by the following general formula (5):

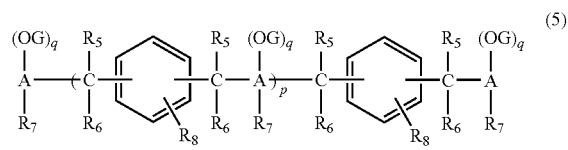

(5)

wherein in general formula (5), A is a naphthalene nucleus, G is a glycidyl group, $R_5$, $R_6$, and $R_8$ each is a hydrogen atom or an alkyl group of 1-6 carbon atoms, $R_7$ is an acenaphthenyl group represented by the following formula (a) or a hydrogen atom, the acenaphthenyl group accounts for 10% by mole or more of $R_7$:

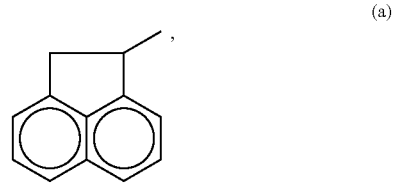

(a)

p is a number of 0-15, and q is 1 or 2.

9. A fire-retardant adhesive film obtained by converting the flame-retardant adhesive composition of claim 8 into a film.

10. The flame-retardant adhesive resin composition of claim 1 wherein the composition is substantially free from halogens and phosphorus.

11. A fire-retardant adhesive film obtained by converting the flame-retardant adhesive composition of claim 10 into a film.

12. A fire-retardant adhesive film obtained by converting the flame-retardant adhesive composition of claim 1 into a film.

* * * * *